United States Patent [19]

Horiguchi

[11] Patent Number: 4,733,096
[45] Date of Patent: Mar. 22, 1988

[54] DIRECTLY DETECTABLE IMAGE SENSOR EMPLOYING A LENS ARRAY AND METHOD OF PRODUCING THE SAME

[75] Inventor: Hiroyuki Horiguchi, Yokohama, Japan

[73] Assignee: Ricoh Company, Ltd., Tokyo, Japan

[21] Appl. No.: 941,742

[22] Filed: Dec. 15, 1986

[30] Foreign Application Priority Data

Dec. 19, 1985 [JP] Japan ................... 60-284370

[51] Int. Cl.⁴ ............................. H01J 40/14
[52] U.S. Cl. ........................ 250/578; 250/216; 355/46; 355/1
[58] Field of Search ............. 250/578, 216; 357/30 K, 357/30 L, 30 M; 350/167; 355/46, 1; 358/293, 294

[56] References Cited
U.S. PATENT DOCUMENTS 4,695,719 9/1987 Wilwerding .................. 250/239

Primary Examiner—David C. Nelms
Assistant Examiner—Chung Seo
Attorney, Agent, or Firm—Oblon, Fisher, Spivak, McClelland & Maier

[57] ABSTRACT

A directly detectable image sensor applicable to an image reader of a facsimile and others includes two glass substrate members which are bonded to each other, and an array of miniature lenses arranged at the interface between the two substrate members and each having a different refractive index from the substrate members. Sensor elements and electrodes are provided on one major surface of a sensor substrate which is made up of the two glass substrate members, a document being laid closely on the other major surface of the sensor substrate. Light is propagated through the sensor substrate from the sensor elements and electrodes side to reach the document, while a reflection from the document is focused onto the sensor elements by the miniature lenses.

18 Claims, 5 Drawing Figures

DIRECTLY DETECTABLE IMAGE SENSOR EMPLOYING A LENS ARRAY AND METHOD OF PRODUCING THE SAME

BACKGROUND OF THE INVENTION

The present invention relates to a directly detectable image sensor applicable to a document reading device of a fascimile terminal and others and a method of producing the same.

In the art of document reading devices, or document readers, such as a one intalled in a facsimile terminal, there has recently been developed a so-called directly detectable image sensor as disclosed in, for example, Japanese Laid-Open Patent Publication No. 60-134486 and a paper entitled "A STUDY ON STRUCTURE OF DIRECTLY DETECTABLE IMAGE SENSOR", Institute of Electronics and Communication Engineers of Japan, Report ED81-35. All of the sensors disclosed comprise a substrate made of glass, a light intercepting layer, an insulating layer, sensor elements and electrodes which are provided on the substrate with the intermediary of the light intercepting and insulating layers, and a transparent protective layer provided on the sensor elements and electrodes and implemented with a thin layer of glass. A document is laid on and held in close contact with the protective layer, so that the sensor elements may read images which are recorded in the document. Specifically, the light intercepting layer and electrodes are individually formed with windows in order to guide light, which is incident to the sensor via the substrate, toward the document, the sensor elements being sensitive to a reflection from the document.

A prerequisite with any of the prior art image sensors of the type described is that in order to attain a sufficient output for an MTF on the order of 0.6, the transparent protective layer be about 75 $\mu$m thick, the windows be sized about 90 $\mu$m $\times$ 60 $\mu$m, and the illuminance on the document surface be about 2500 lx. Under this condition, the the protective layer should be implemented with a glass sheet which is as thin as about 70 to 80 $\mu$m. A problem with such a thin protective layer is that it deteriorate the sensor elements due to adhesion or an adhesive itself and is dynamically fragile to limit the yield. Another problem is that in the event of installation of such a sensor in a facsimile terminal, for example, a special consideration have to be given to external forces which may damage the sensor, resulting in an increase in cost. Furthermore, it is difficult for the image sensor to be provided with a high resolution such as 16 dots/mm since each of the windows should be as great as about 90 $\mu$m $\times$ 60$\mu$m. Specifically, any of the prior art systems cannot achieve a resolution of 16 dots/mm unless the windows are halved in size and the protective layer is implemented with a glass film whose thickness is less than about 30 $\mu$m. This would not only lower the sensor output but also aggravate the fragile nature of the sensor.

SUMMARY OF THE INVENTION

It is therefore an object of the present invention to provide a directly detectable image sensor for a document reader which attains a high resolution and a high output, and a method of producing the same.

It is another object of the present invention to provide a directly detectable image sensor for an image reader which is dynamically rigid and durable, and a method of producing the same.

It is another object of the present invention to provide a directly detectable image sensor for an image reader which is free from deterioration due to adhesion of the sensor and a substrate, and a method of producing the same.

It is another object of the present invention to provide a generally improved directly detectable image sensor and a method of producing the same.

A directly detectable image sensor for reading images which are recorded in a document of the present invention comprises a first and a second substrate members each being made of a transparent material and bonded at one surface thereof to each other to constitute a sensor substrate, an array of miniature lenses made of a material having a different refractive index from the first and second substrate members and arranged at an interface between the first and second substrate members, and sensor means provided on a surface of one of the first and second substrate members.

The above and other objects, features and advantages of the present invention will become more apparent from the following detailed description taken with the accompanying drawings.

DESCRIPTION OF THE PREFERRED EMBODIMENTS

Figure 1:
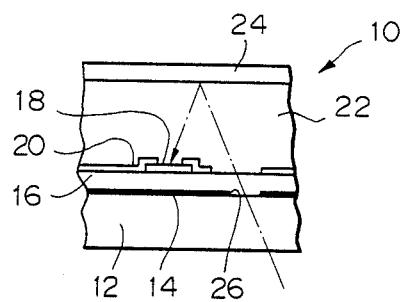
FIG. 1 is a section of a prior art directly detectable image sensor.

To better understand the present invention, a brief reference will be made to a prior art directly detectable image sensor and a method of producing it, shown in FIG. 1. As shown in FIG. 1, a prior art image sensor of the type described, generally 10, includes a glass substrate 12 and a light intercepting layer 14 and an insulating layer 16 which are seqentially provided on the substrate 12. Sensor elements 18 and electrodes 20 are disposed on the substrate 12 with the intermediary of the layers 14 and 16. Further, a transparent protective layer 22 which comprises a thin layer of glass is provided on the sensor elements 18 and electrodes 20. A document 24 is laid closely on the protective layer 22 so that the sensor elements 18 may read images which are carried on the document 24. Specifically, the light intercepting layer 14 and electrodes 20 are individually formed with windows 26 so as to guide light which is incident to the sensor 10 via the substrate 12, the sensor elements 18 being sensitive to a reflection from the document 24.

The prior art directly detectable sensor 10 having the above construction has various problems, as previously discussed.

Figure 2:
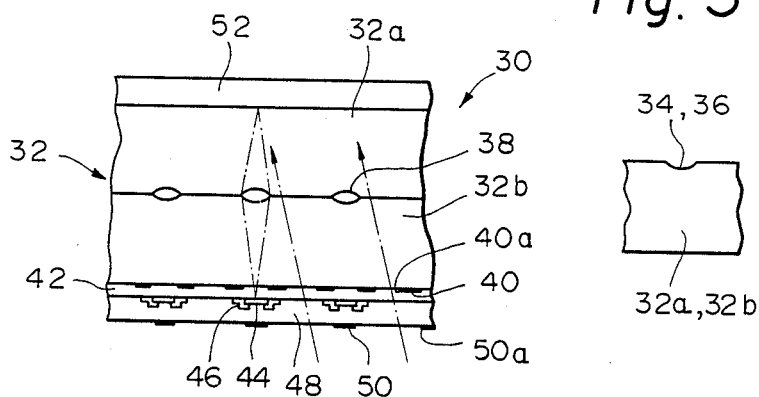
FIG. 2 is a section showing a directly detectable image sensor embodying the present invention and a method of producing it.
Figure 3:
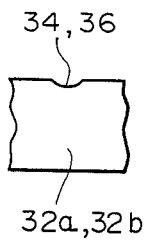
FIG. 3 is a section of a glass substrate which is included in the sensor of FIG. 2.
Figure 4:
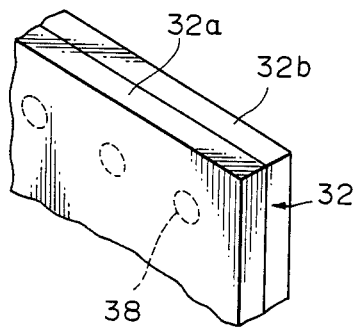
FIG. 4 is a perspective view of the glass substrate.

Referring to FIGS. 2 to 4, a directly detectable image sensor embodying the present invention and a method of producing it are shown. As shown, the image sensor, generally 30, includes a sensor substrate 32 which is made up of a pair of glass substrate members 32a and 32b which are bonded to each other. Specifically, the glass substrate member 32a is formed with recesses 34 in its rear surface and in exact alignment with those positions where sensor bits are to be defined, and the glass substrate member 32b is formed with recesses 36 which are identical with the recesses 34. The recesses 34 and 36 define, respectively one and the other halves of a lens of the array 38. A material whose refractive index is different from that of the substrate members 32a and 32b is filled in the recesses 34 and 36 to constitute the miniature lens array 38. A light intercepting layer 40 having windows 40a and an insulating layer 42 are provided on one major surface of the substrate 32, i.e., the surface of the substrate member 32b, whereafter sensor elements 44, electrodes 46 and a protective layer 48 are provided sequentially. Then, another light intercepting layer 50 having windows 50a is deposited on the protective layer 48. In this structure, a document 52 is to be laid on the other surface of the substrate 32, i.e, the surface of the substrate member 32.

More specifically, the substrate members 32a and 32b are each made of borosilicate glass and provided with a thickness of 0.5 mm. The recesses 34 and 36 are formed in the substrate members 32a and 32b, respectively, with a radius of curvature of 1 mm and a thickness of about 0.05 mm, whereafter the substrate members are optically polished (see FIG. 3). The recesses 34 and 36 are filled with an amorphous diamond by plasma CVD technology and, then, the substrate members 32a and 32b are bonded together to have the array of miniature lenses 38 therebetween each of which serves as a cylindrical convex lens (see FIG. 4). The resulting sensor substrate 32 is provided with the light intercepting layer 40 and windows 40a by 2000 Å NiCr vacuum deposition, followed by deposition of $SiO_2$ to a thickness of about 1 μm to constitute the insulating layer 42. Then, an a-Si : H film is provided on the insulating layer 42 by plasma CVD technology so that the sensor elements 44 are formed in a 16 dots/mm bit pattern in the imaging portions which are defined by the individual miniature lenses 38. Further, the electrodes 46 are provided in such a manner as to support the sensor elements 44. The protective layer 48 may comprise an $Si_3N_4$ layer which is also deposited by plasma CVD technology. The light insulating layer 50 may be made of NiCr by way of example.

As shown in FIG. 2, the document 52 is laid on the surface of the substrate member 32a which is opposite to the surface of the substrate member 32b where the sensor elements 44 are provided. Light is incident to that side of the sensor 30 which adjoins the sensor elements 44 and propagated through the windows 50a, windows 40a and substrate 32 to reach the document 52. A reflection from the document 52 is focused onto and read by the individual sensor elements 44 by their associated miniature lenses 38. An experiment showed that when the windows 50a are sized 50μm×40 μm each and the illuminance on the document surface is about 100 lx, an MTF of up to 0.7 is achieved.

As described above, in this particular embodiment, the sensor 30 is basically identical with an ordinary a-Si directly detectable image sensor in that the light intercepting layer 40, insulating layer 42, sensor elements 44 and electrodes are provided sequentially. The sensor substrate 32 is made up of two glass substrate members 32a and 32b which are bonded together with the miniature lens array 38 interposed therebetween, whereby images on a document are focused onto the sensor elements 44 by their associated miniature lenses 38. This eleminates the deterioration of sensor elements which has heretofore been brought about by the adhesion of the sensor elements and a substrate. The substrate 32 is dynamically rigid and, therefore, durable. Because the reflection from a document is focused onto the sensor elements 44 by the miniature lens array 38, the output can be improved by one digit (in the case of 2,500 lx illuminance) than the prior art system, realizing a resolution as high as 16 dots/mm.

Figure 5:
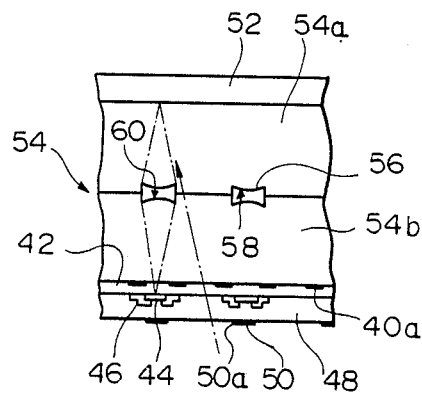
FIG. 5 is a section showing another embodiment of the present invention and a method of producing it.

Referring to FIG. 5, another embodiment of the present invention is shown. In FIG. 5, the same or similar structural elements as those shown in FIGS. 2 to 4 are designated by like reference numerals. The structure shown in FIG. 5 essentially similar to that of FIGS. 2 to 4 except that the cylindrical convex lenses in the array 38 are replaced with cylindrical concave lenses which are also arranged in an array 56. Specifically, a sensor substrate 54 comprises a pair of glass substrate members 54a and 54b between which the miniature lens array 56 is provided. The lens array 56 may be formed by, for example, filling recesses 58 and 60 of the substrate members 54a and 54b with dry nitrogen. In this case, too, images on a document are successfully focused onto the individual sensor elements 44. MTFs of up to 0.6 were measured with this alternative structure.

In summary, it will be seen that the present invention provides a directly detectable image sensor which has dynamic rigidity and, therefore, durability and attains a high output and a high resolution due to an array of miniature lenses. Further, the image sensor of the present invention is free from deterioration otherwise caused to a sensor due to adhesion of a sensor and a sensor substrate.

Various modifications will become possible for those skilled in the art after receiving the teachings of the present disclosure without departing from the scope thereof.

What is claimed is:

1. A directly detectable image sensor for reading images which are recorded in a document, comprising:
    a first and a second substrate members each being made of a transparent material and bonded at one surface thereof to each other to constitute a sensor substrate;
    an array of miniature lenses made of a material having a different refractive index from said first and second substrate members and arranged at an interface between said first and second substrate members; and
    sensor means provided on a surface of one of said first and second substrate members.

2. A directly detectable image sensor as claimed in claim 1, further comprising a light intercepting layer provided on said surface of said one substrate and formed with windows for illumination of a document, and an insulating layer provided on said light intercepting layer, said sensor means being provided on said insulating layer.

3. A directly detectable image sensor as claimed in claim 2, further comprising a protective layer covering a surface of said insulating layer and said sensor means entirely and formed with windows for incidence of light.

4. A directly detectable image sensor as claimed in claim 1, wherein said first and second substrate members are made of borosilicate glass.

5. A directly detectable image sensor as claimed in claim 1, wherein said miniature lenses are made of amorphous diamond.

6. A directly detectable image sensor as claimed in claim 1, wherein said sensor means comprises sensor elements and electrodes which support said sensor elements in one-to-one correspondence.

7. A directly detectable image sensor as claimed in claim 2, wherein said light intercepting layer is made of NiCr.

8. A directly detectable image sensor as claimed in claim 2, wherein said insulating layer is made of $SiO_2$.

9. A directly detectable image sensor as claimed in claim 3, wherein said protective layer is made of $Si_3N_4$.

10. A method of producing a directly detectable image sensor for reading images which are recorded in a document, comprising the steps of:
   (a) providing two flat substrate members which are made of a transparent material;
   (b) forming recesses having a predetermined configuration in those positions of one surface of said substrate members which are aligned with each other;
   (c) polishing surfaces of said recesses optically;
   (d) filling said recesses with an optical substance;
   (e) bonding said substrate members to each other, whereby an array of miniature lenses are provided at the interface between said substrate members;
   (f) providing a light intercepting layer on an outer surface of one of said substrate members, said light intercepting layer being formed with windows for illumination of a document;
   (g) providing an insulating layer on said light intercepting layer; and
   (h) providing sensor elements and electrodes on said insulating layer.

11. A method as claimed in claim 10, further comprising the step of (i)providing a protective layer which covers said insulating layer, sensor elements and electrodes entirely.

12. A method as claimed in claim 10, wherein said flat substrate members comprise a 0.5 mm thick borosilicate glass substrate each.

13. A method as claimed in claim 10, wherein said recesses are 1 mm in the radius of curvature and 0.05 mm in depth.

14. A method as claimed in claim 10, wherein said optical substance comprises amorphous diamond, step (d) comprising filling said recesses with the amorphous diamond by a plasma CVD process.

15. A method as claimed in claim 10, wherein step (f) comprises providing said light intercepting layer and windows for the illumination of a document by vacuum deposition of NiCr to a thickness of 2000 Å.

16. A method as claimed in claimed in 10, wherein said insulating layer comprises an $SiO_2$ layer which is 1 $\mu$m thick.

17. A method as claimed in claim 10, wherein said sensor elements are formed by providing an a-Si : H film by a plasma CVD process.

18. A method as claimed in claim 11, wherein step (i) comprises providing said protective layer by a plasma CVD process.

* * * * *